United States Patent [19]
Lim

[11] Patent Number: 5,144,256
[45] Date of Patent: Sep. 1, 1992

[54] METHOD AND APPARATUS FOR DEMODULATING A GMSK SIGNAL

[75] Inventor: Mu-gil Lim, Seoul, Rep. of Korea

[73] Assignee: Samsung Electronics Co., Ltd., Kyunggi, Rep. of Korea

[21] Appl. No.: 723,278

[22] Filed: Jun. 28, 1991

[30] Foreign Application Priority Data

Dec. 31, 1990 [KR] Rep. of Korea .................. 90-22760

[51] Int. Cl.$^5$ ............................................. H03D 3/00
[52] U.S. Cl. ...................................... 329/302; 375/80; 375/90
[58] Field of Search ................. 329/300, 302, 303; 375/47, 80, 81, 82, 90

[56] References Cited

U.S. PATENT DOCUMENTS 5,048,058 9/1991 Kaleh .............................. 329/300 X Primary Examiner—David Mis
Attorney, Agent, or Firm—Rothwell, Figg, Ernst & Kurz

[57] ABSTRACT

A method for demodulating a GMSK signal and the apparatus thereof is disclosed. The apparatus is applied to a digital communication system and demodulates a GMSK signal which is received from the transmitting source. The apparatus for demodulating the GMSK signal comprises a frequency converter for converting the received GMSK signal into a baseband and separating the converted signals into the received I and Q component signals, an A-D converter for quantizing the received I and Q component signals of the baseband separated in the frequency converter and encoding the quantized I and Q component signals to generate the I and Q component receiving data, a memory where the standard waveform data with respect to the standard waveform is stored, an offset error detector for checking the correlation between the I and Q component receiving data and the standard waveform data and detecting the slot interval and the offset error, a phase locking portion for selecting the I and Q component slot data by the slot interval information and the offset error detected in the offset error detector and compensating the offset error of the selected I and Q component slot data, and a software determiner for integrating the predetermined number of data among the I and Q component slot data compensated in the phase locking portion and determining the I and Q component demodulation data according to the integrated result.

5 Claims, 8 Drawing Sheets

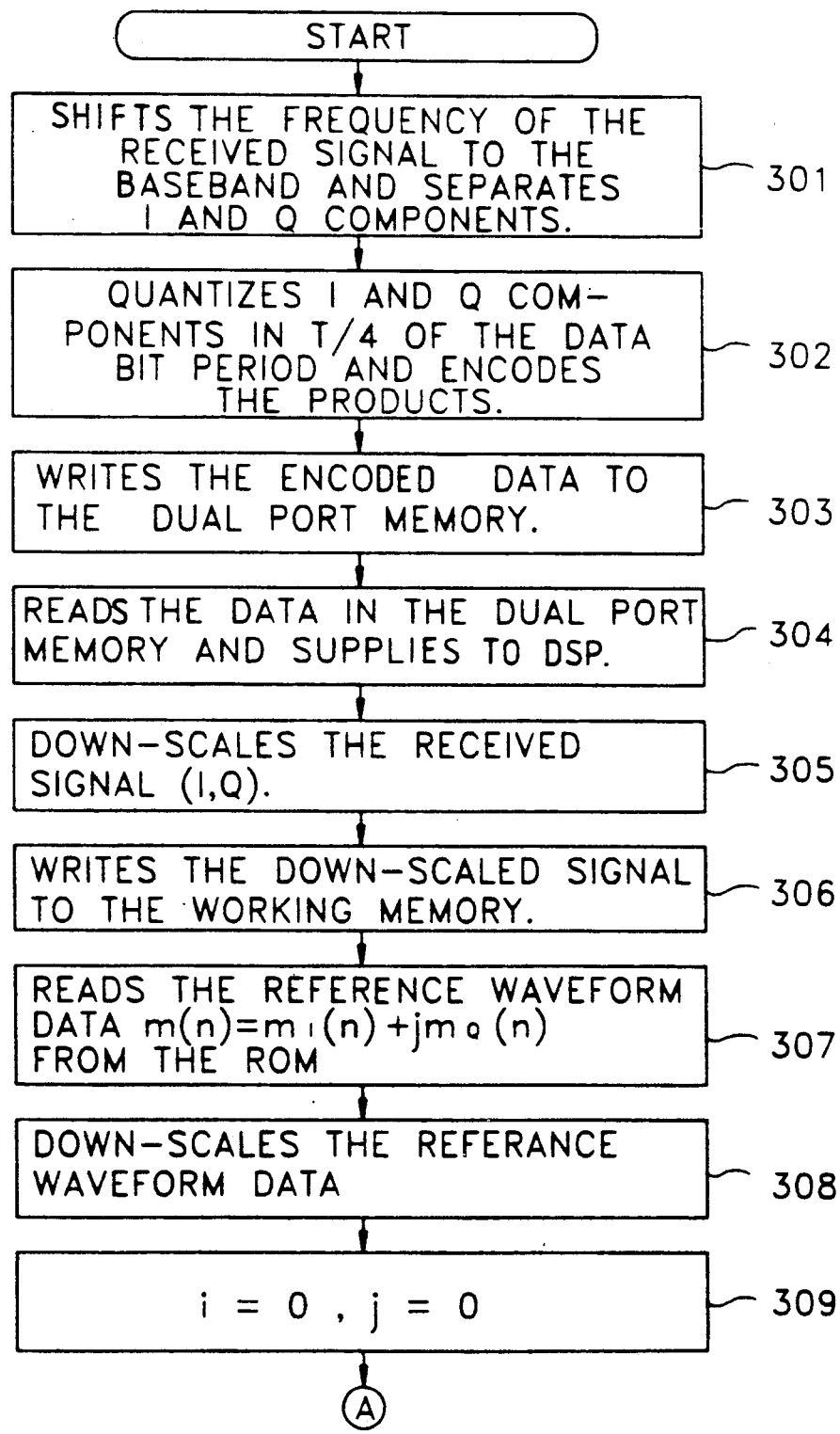

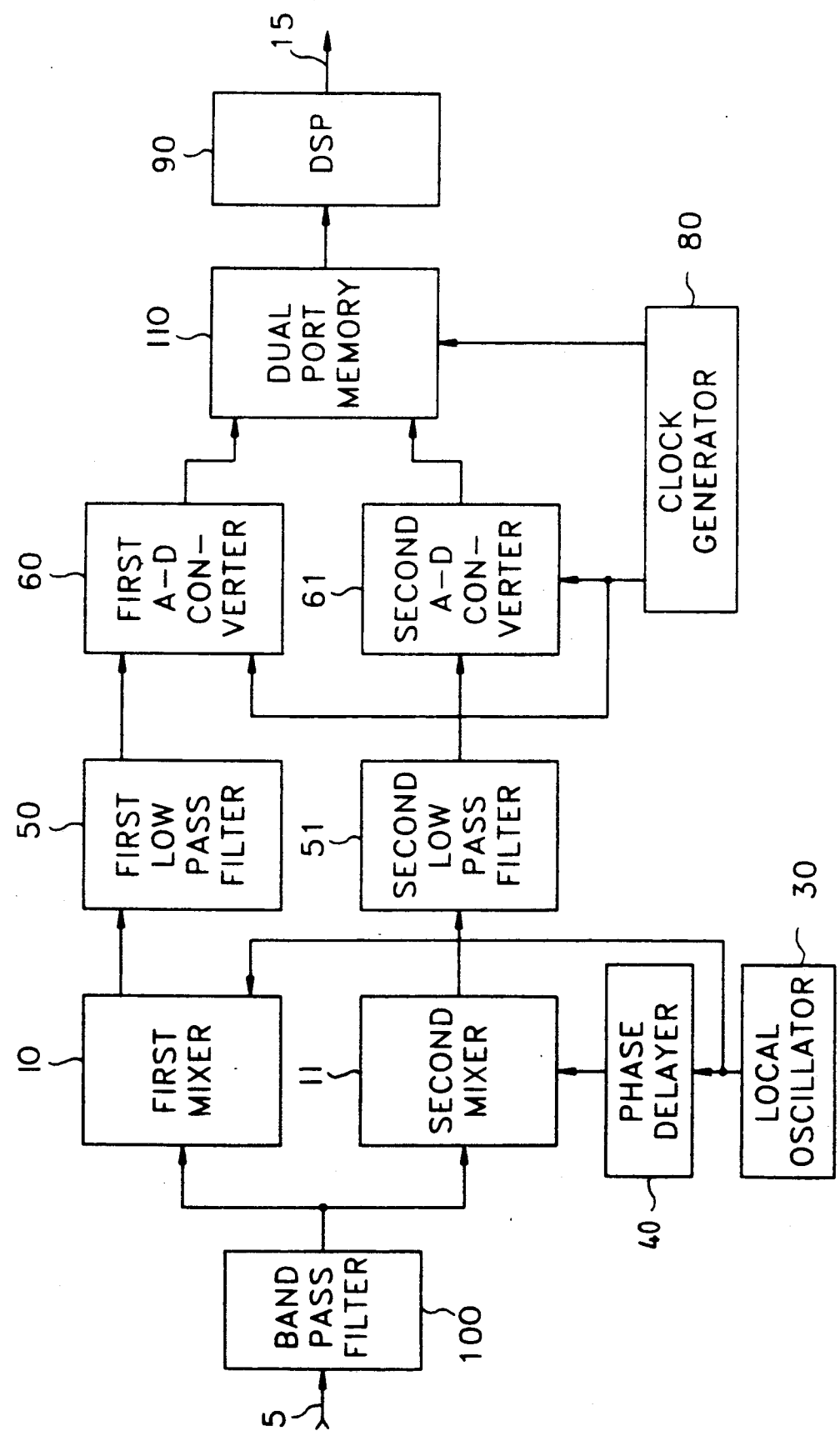

METHOD AND APPARATUS FOR DEMODULATING A GMSK SIGNAL

BACKGROUND OF THE INVENTION

The present invention relates to a digital modulation/demodulation technique, and more particularly to a method for demodulating a Gaussian Filtered Minimum Shift Keying (GMSK) modulated signal, and the apparatus thereof.

Generally, the GMSK method is one of the quadrature modulation methods for transmitting digital data, and a signal modulated by this method has the good properties of constant envelope and a relatively narrow occupied frequency bandwidth, thereby having an advantage of effectively using the limited frequency bandwidth resource of the electromagnetic spectrum. Thus, the GMSK modulation/demodulation method is suited for portable radio communication apparatus and has recently become a most excellent method for portable radio communication in the rapid digitization of portable radio communication apparatus now taking place.

Generally, in the demodulation process of GMSK, the response characteristic of the Gaussian low-pass filter has a response time that is longer than one period with respect to one period of the pulse input, so that the effect of interference generated between symbols which effects the before-and-after symbol data is severe.

Accordingly, the GMSK demodulation apparatus can demodulate the transmitted data exactly by matching the phase and frequency of the local oscillating signal of the local oscillator used therein to those of the carrier oscillating signal used in demodulation, as in cases of other types of digital demodulators.

For this to occur, a conventional GMSK demodulation apparatus uses a phase locking loop circuit that includes a feedback circuit as a circuit for detecting the phase and the frequency of the carrier oscillating frequency to generate a local oscillating signal identical to the carrier oscillating frequency used in the demodulator.

In the case of the GMSK demodulation apparatus that includes an analog type feedback circuit, a high degree of accuracy is required to control the whole system and the circuit structure is so very complicated that miniaturization is very difficult to achieve.

The aforementioned problem will be described with reference to the accompanying drawing.

FIG. 1 is a circuit diagram of a conventional GMSK demodulation apparatus. In FIG. 1, a first mixer 10 mixes an output signal of a first local oscillator 30 which is phase-delayed by $\pi/2$ and received through a first phase delayer 40 and a demodulated signal received through an input terminal 5 to generate a Q component receiving signal of a baseband frequency. A second mixer 11 mixes an output signal of the first local oscillator 30 and the demodulated signal received through the input terminal 5, to generate an I component receiving signal of a baseband frequency. A clock restoring circuit 20 restores a clock pulse train having a frequency identical to the data transfer rate from the demodulated signal received through the input terminal 5. First and second low-pass filters 50 and 51 filter the Q and I component receiving signals of the baseband frequency, respectively, to remove high frequency noise. First and second absolute value converters 60 and 61 convert the received Q and I component signals of the baseband frequency which are low-pass filtered, according to the clock pulse train restored in the clock restoring circuit 20, into digital data form having a logic state of "1" or "0". An adder 62 sums the received data of the Q and I components generated in the first and second absolute value converters 60 and 61, to generate digital data in its original form prior to modulation. A loop filter 70, third and fourth mixers 12 and 13, and the second phase delayer 41 which functions as a feedback loop circuit, control the phase and the frequency of the output of the local oscillator 30.

As described in FIG. 1, the conventional GMSK demodulation apparatus includes an analog type feedback loop circuit and also a clock restoring circuit 20 that must control the first and second absolute value converters 60 and 61, and since there are many difficulties in its circuit design, miniaturizing the circuit to one chip is not feasible.

SUMMARY OF THE INVENTION

Accordingly, it is an object of the present invention to provide a GMSK demodulation method and the apparatus thereof which can simplify the constitution of the circuit, miniaturize the apparatus and reduce the power consumption.

To achieve the object, the method of the present invention comprises:

a frequency converting step of shifting the received GMSK signal into a baseband and separating the shifted GMSK signal into I and Q component signals;

an A-D converting step of quantizing the I and Q component signals of the baseband separated in the frequency converting step into a predetermined period, and encoding the quantized I and Q component signals received to generate the I and Q component data;

an offset error detecting step for checking the correlation between the I and Q component data generated in the A-D converting step and a standard waveform data to detect the slot interval and offset error amount;

a phase locking step for selecting the I and Q component slot data by the slot interval information and the amount of offset error detected in the offset error detecting step and compensating the offset error of the selected I and Q component slot data; and a software decision step for integrating a predetermined number of data among the I and Q component slot data compensated in the phase locking step and deciding the I and Q component demodulation data according to the results of integration.

To achieve the object, the apparatus of the present invention comprises:

a frequency converter for shifting the received GMSK signal into a baseband and separating the converted signal into I and Q component signals;

an A-D converter for quantizing the I and Q component signals of the baseband separated in the frequency converter into a predetermined period and encoding the quantized I and Q component data to generate I and Q component data;

a memory where the standard waveform data with respect to the standard waveform is stored;

an offset error detector for checking the correlation between the I and Q component data generated in the A-D converter and the standard waveform data stored in the memory to detect the slot interval and the offset error;

a phase locking portion for selecting the I and Q component slot data by the slot interval information and the amount of offset error detected in the offset error detector and compensating the offset error of the selected I and Q component slot data; and a software determiner for integrating a predetermined number of data among the I and Q component slot data compensated in the phase locking portion and determining the I and Q component demodulation data according to the result of integration.

BRIEF DESCRIPTION OF THE DRAWINGS

The above object and other advantages of the present invention will become more apparent by describing the preferred embodiments of the present invention with reference to the attached drawings, in which:

FIGS. 3A-3E are a flowchart of an embodiment of the GMSK signal demodulation method according to the present invention; and FIG. 4 is a system diagram for carrying out the method shown in FIGS. 3A-3E are.

DETAILED DESCRIPTION OF THE INVENTION

Figure 1:
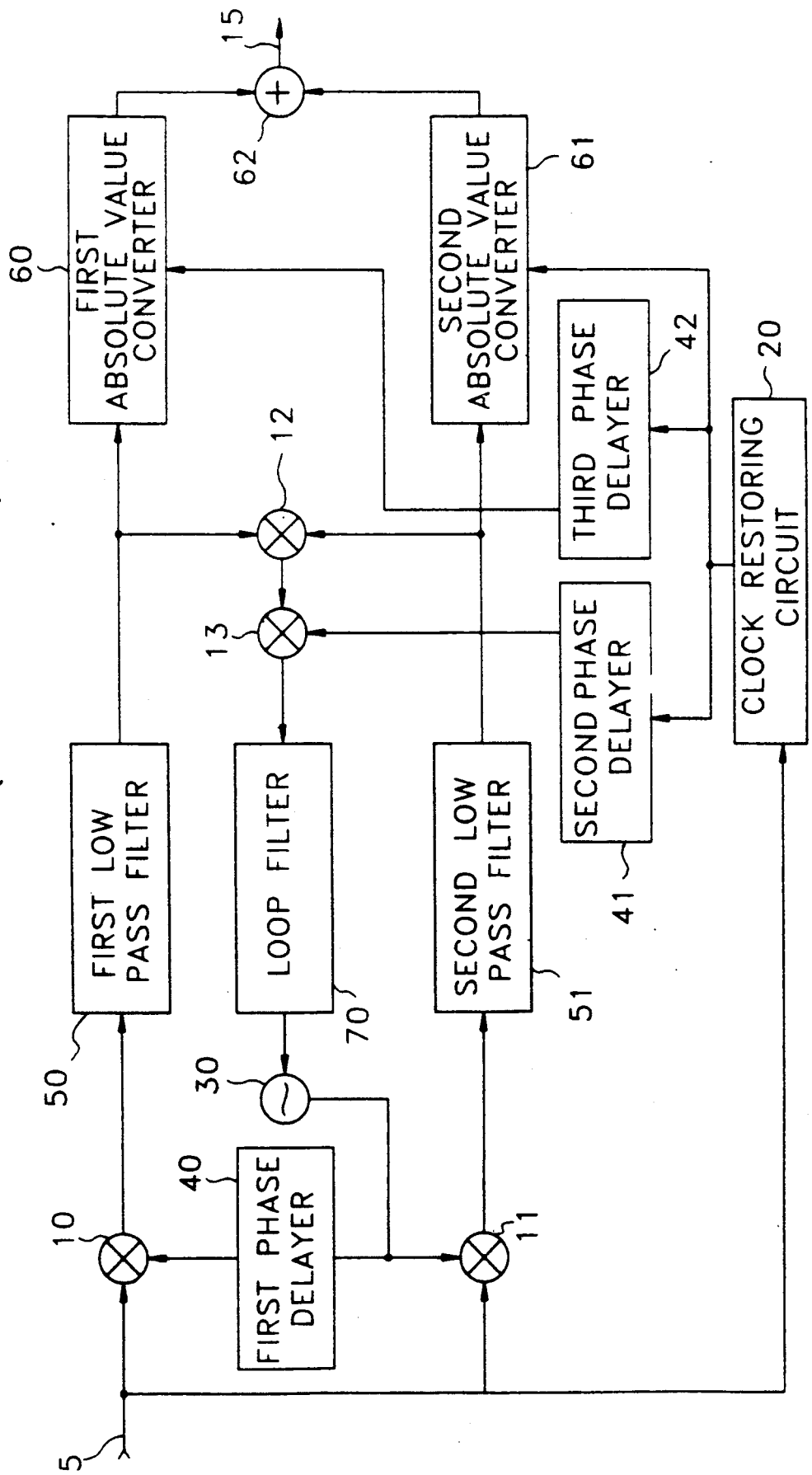
FIG. 1 is a circuit diagram of the conventional GMSK signal demodulation apparatus.

Hereinafter, the present invention will be described in detail with reference to the accompanying drawings.

First of all, prior to the description of the digital demodulation method and the apparatus thereof according to the present invention, the GMSK method will be described.

The NRZ signal to be transmitted, rect(t/T) is $$rect(t/T) = \begin{bmatrix} 1/T |t| < (\tfrac{1}{2})T \\ 0 \quad \text{elsewhere} \end{bmatrix} \quad (1)$$

and the signal x(t) modulated by the GMSK method is $$x(t) = (2Ec/T)^{\frac{1}{2}} \cos(2\pi f_0 t + \Phi(t) + \Phi_0) \quad (2)$$

where
Ec is energy per transmitted data bit,
$f_0$ is carrier frequency, and
$\Phi_0$ is an arbitrary instantaneous phase.
Converting Eq. (2) into trigonometric functions, it is given as $$\begin{aligned} x(t) &= (2Ec/T)^{\frac{1}{2}} \cdot \cos(2\pi f_o t + \Phi(t) + \Phi_o) \cdot \\ &= (2Ec/T)^{\frac{1}{2}} \cdot \{\cos(2\pi f_o t + \Phi_o)\cos\Phi(t) - \\ &\quad \sin(2\pi f_o t + \Phi_o)\sin\Phi(t)\} \end{aligned} \quad (3)$$

In this equation, the terms of $\cos(2\pi f_0 t + \Phi_0)$ and $\sin(2\pi f_0 t + \Phi_0)$ are totally related to the carrier frequency $f_0$. Since the signal components $\cos \Phi(t)$ and $\sin \Phi(t)$ are loaded in the carrier and then unloaded into the baseband, $f_0$ acts only as a simple carrier. Since the value $\Phi_0$ in the term $\cos(2\pi f_0 t + \Phi_0)$ is changed whenever the NRZ signal is modulated in the modulator, the value shows the arbitrary instantaneous phase value for each case. In other words, given an instantaneous phase value $\Phi_1$ when t is equal to $t_1$ and an instantaneous phase value $\Phi_2$ when t is equal to $t_2$, the values $\cos(2\pi f_0 t_1 + \Phi_1)$ and $\cos(2\pi f_0 t_2 + \Phi_2)$ become different. These two terms are totally related to the carrier, and substantially, the information for the transmitted GMSK modulation contains the in-phase signal information $\cos \Phi$ (t) and the quadrature phase signal $\sin \Phi$ (t). Accordingly, the demodulation signal U(t) in the baseband is defined as follows:

$$U(t) = \cos \Phi(t) + j \sin \Phi(t)$$

Using U(t), Eq. (3) can be rewritten as:

$$X(t) = Re\{U(t) \cdot e^{j(2\pi f_0 t + \Phi_0)}\}$$

where Re{ ... } means the real part of the equation. $\Phi$ (t) in the signal information $\cos \Phi$ (t) + j $\sin \Phi$ (t) of the GMSK modulation signal is modulated in the modulator to have the value as follows:

$$\Phi(t) = \sum_i a_i \pi h \int_{-\infty}^{t_1 - iT} g(u) du \quad (4)$$

In equation (4), where h is a modulation index and is $\tfrac{1}{2}$ in the case of GMSK, $\alpha$ i is an input NRZ pulse defined by Eq. (1), and g(t) is $$g(t) = h(t) * rect(t/T) \quad (5)$$

Here, * means a convolution operation, h(t) which is an impulse response function of the Gaussian low-pass filter used in the modulation is given as:

$$h(t) = \exp(-t^2/2\sigma^2 T^2)/(2\pi\sigma T) \quad (6)$$

In Eq. (6), $$\sigma = [\ln(2)]^{\frac{1}{2}}/2\pi BT \quad (7)$$

In Eq. (7), B is a 3 dB bandwidth of a Gaussian low-pass filter, and T is an input period of a transmitted digital data input signal. As known in Eq. (4), in the calculation of the value $\Phi$ (t) in the in-phase signal component $\cos \Phi$ (t) of the modulated GMSK signal, since the integration is carried out from the data input time, i.e., $t = -\infty$, to the current data input time, i.e., $t = t_0$, and accordingly the integrated value at $t = t_0$ always includes the previous integrated value, the value $\Phi$ (t) is obtained without any discontinuous point. That is, in the case of $t < t_2$, these are given $$\begin{aligned} \Phi(t_1) &= \sum_i a_i \pi h \int_{-\infty}^{t_1 - iT} g(u) du \\ \Phi(t_2) &= \sum_i a_i \pi h \int_{-\infty}^{t_2 - iT} g(u) du \\ &= \sum_i a_i \pi h \int_{-\infty}^{t_1 - iT} g(u) du + \\ &\quad \sum_i a_i \pi h \int_{t_1 - iT}^{t_2 - iT} g(u) du \end{aligned}$$

Accordingly, since the preceding value is always memorized, the continuous function value is obtained. In Eq. (7), the pulse form is changed by the result of Eq. (5) according to the value BT which is the product of the 3 dB bandwidth of the Gaussian low-pass filter by the signal transfer period T. That is, since the response time of the filter with respect to the NRZ pulse inputted for 1T in the Gaussian low-pass filter is from 1 T to 9 T and has a longer response time than 1 T, the phase integration value Φ (t) with respect to the current input NRZ data includes the effect due to the preceding bit. Similarly, the current input data generates the interference effect between symbols which affects the phase integration value of the following bit, so that the effect due to the interference between symbols should be sufficiently considered in the step for restoring the signal of the receiver.

The signal modulated through the aforementioned process is transmitted in a form through the transmitting medium of the time division system.

That is, as in the present invention, the frame structure of the GSM (Group Special Mobile) system has eight time slots per frame using the TDMA (Time Division Multiple Access) method. As for the types of the time slots, there are four (Normal, Synchronization, Frequency Correction, Random Access) bursts, and the training sequence is positioned in the middle of each burst. In the receiving terminal, since the training sequence is the mid-amble, the important information required for locking and equalization is extracted from the mid-amble.

In the present invention, the modulation waveform for the mid-amble is stored in the memory apparatus in advance and through calculating the correlation function with the received signal to detect the corresponding portion of the mid-amble signal, exact locking is achieved.

Figure 2:
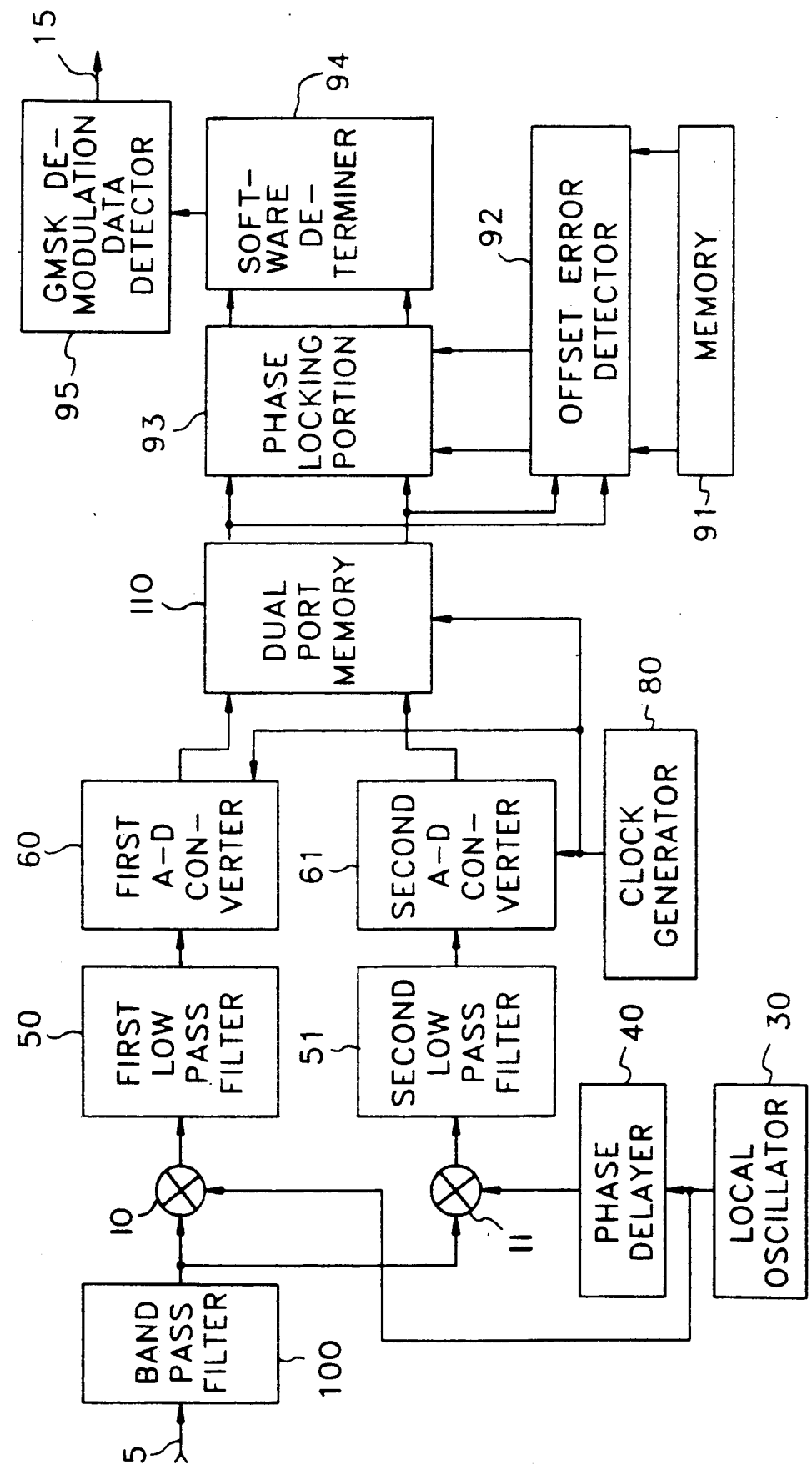
FIG. 2 is a circuit diagram of an embodiment of the GMSK signal demodulation apparatus according to the present invention.
Figure 3B:
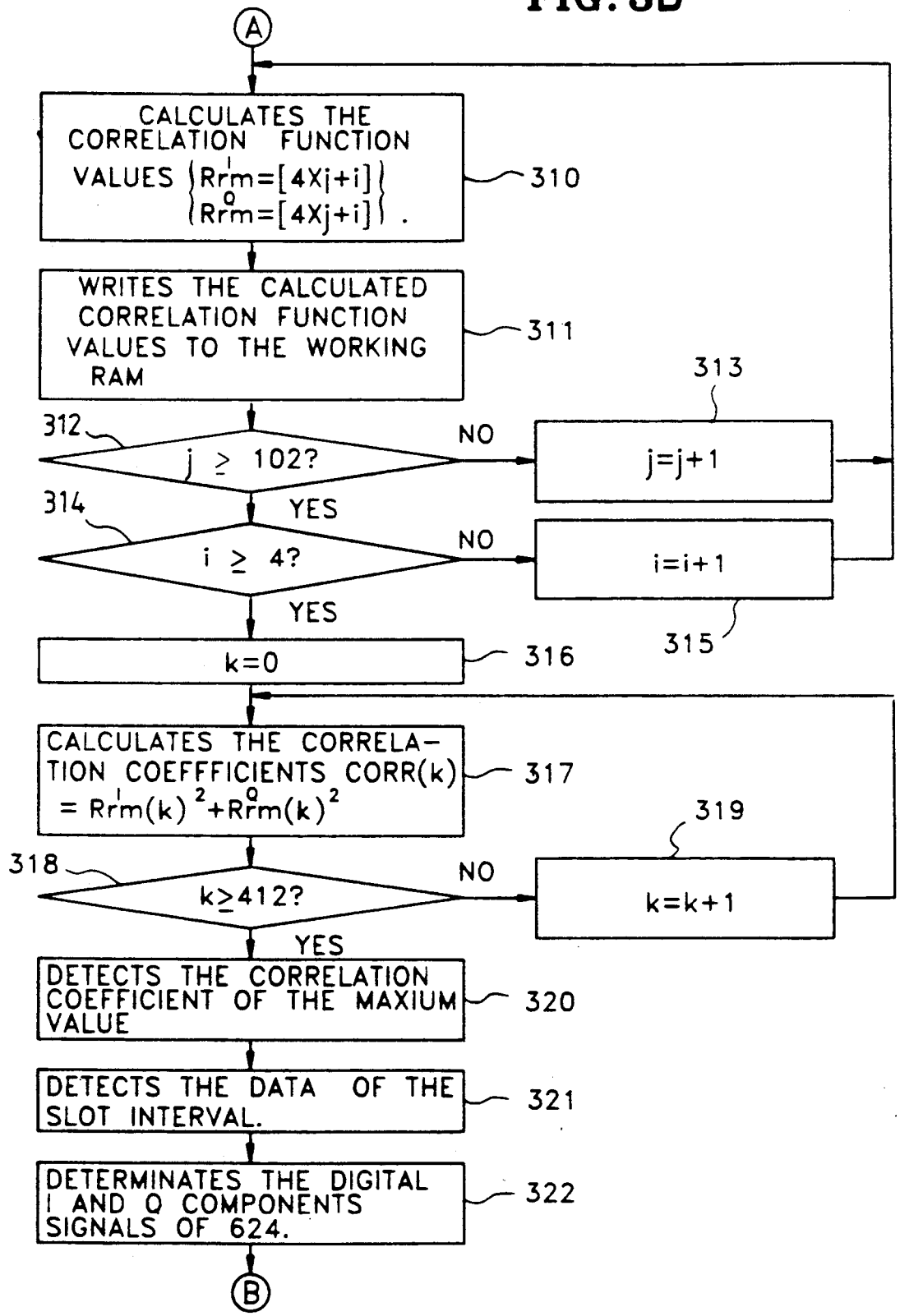
Figure 3C:
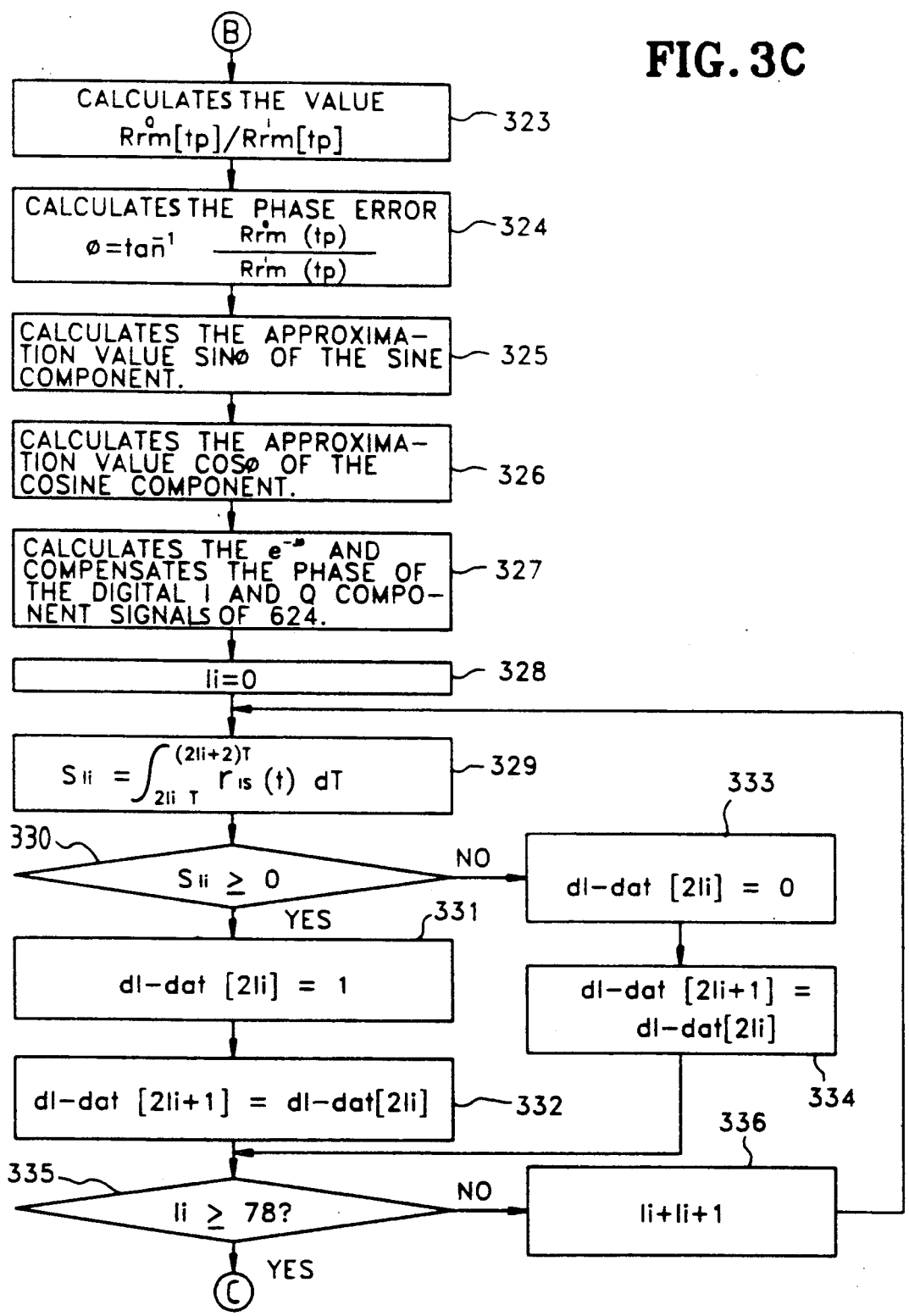
Figure 3D:
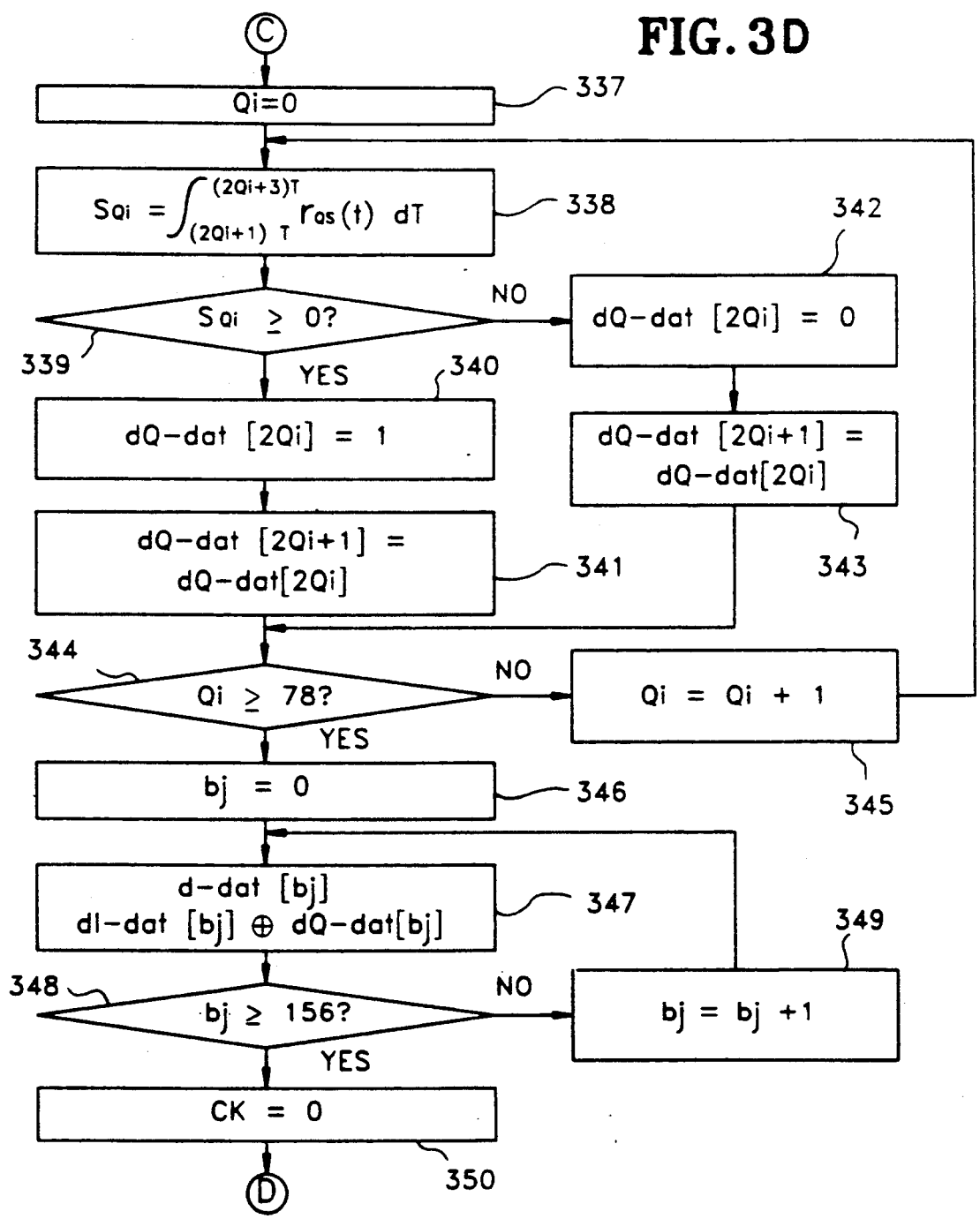
Figure 3E:
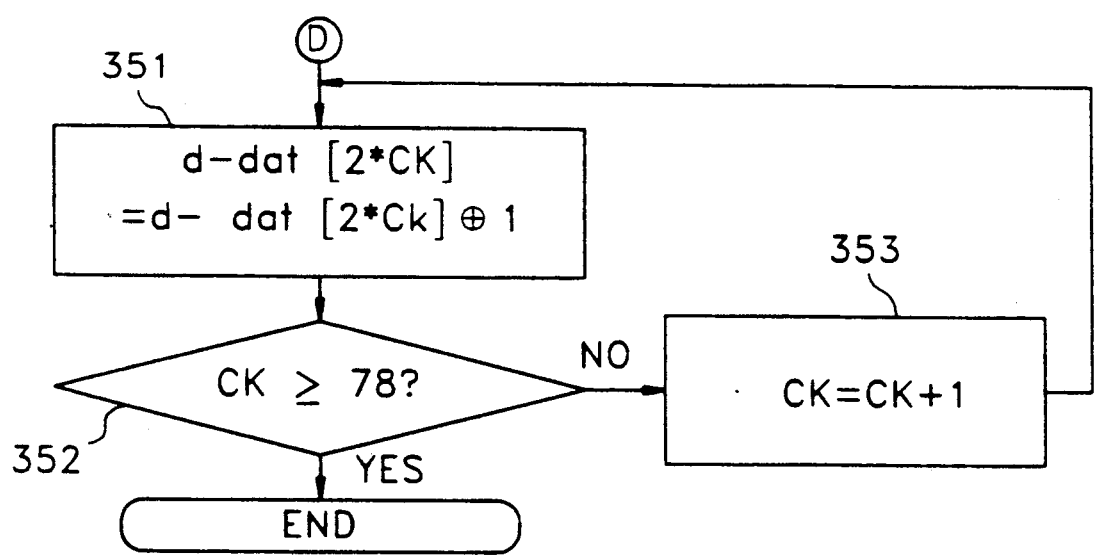

FIG. 2 is a circuit diagram of an embodiment of a GMSK signal demodulation apparatus according to the present invention, wherein like elements of FIG. 1 are denoted by like reference numerals. In FIG. 2, an input terminal 5 is connected to a tuner or a frequency converter to receive a transmitted GMSK signal. The input terminal 5 is also connected to an input terminal of a band pass filter 100. An output terminal of the band pass filter 100 is connected to first input terminals of first and second mixers 10 and 11. An output terminal of a local oscillator 30 is connected to an input terminal of a phase delayer 40 and a second input terminal of the first mixer 10. An output terminal of the phase delayer 40 is connected to a second input terminal of the second mixer 11. An output terminal of the first mixer 10 is connected to an input terminal of the first low-pass filter 50. The output terminal of the first low-pass filter 50 is connected to an input terminal of a first A-D converter 60. An output terminal of the first A-D converter 60 is connected to a first input terminal of a dual port memory 110. An output terminal of the second mixer 11 is connected to an input terminal of a second low-pass filter 51. An output terminal of the second low-pass filter 51 is connected to an input terminal of a second A-D converter 61. An output terminal of the second A-D converter 61 is connected to a second input terminal of the dual port memory 110. First and second output terminals of the dual port memory 70 are connected to first and second input terminals of the phase locking portion 93 and first and second input terminals of an offset error detector 92. First and second output terminals of a memory 91 are connected to third and fourth input terminals of the offset error detector 92. First and second output terminals of the offset error detector 92 are connected to third and fourth input terminals of the phase locking portion 93. First and second output terminals of the phase locking portion 93 are connected to first and second input terminals of a software determiner 94. First and second output terminals of the software determiner 94 are connected to first and second input terminals of a GMSK demodulation data detector 95. An output terminal of the GMSK demodulation data detector 95 is connected to an output terminal 15. The output terminal 15 is connected to a digital data processor. And an output terminal of a clock generator 80 is connected to control terminals of the first and second A-D converters 60 and 61 and a control terminal of the dual port memory 110.

The signal which is GMSK-demodulated in the demodulation part and transmitted through the transmitting component is received through the receiving filter 100 of the demodulation apparatus. At this time, the received signal which is a signal transmitted from the transmitting terminal is a real part of:

$$U(t)e^{j(2\pi f_0 t + \Phi_0)}.$$

That is, the received signal is:

$$Re\{U(t)e^{j(2\pi f_0 t + \Phi_0)}\} = Re\{[\cos\Phi(t) + j\sin\Phi(t)] \cdot [\cos(2\pi f_0 t + \Phi_0)] + j\sin(2\pi f_0 t + \Phi_0)\} \quad (8)$$
$$= \cos(2\pi f_0 t + \Phi_0)\cos\Phi(t) - \sin(2\pi f_0 t + \Phi_0)\sin\Phi(t)$$

The mixers 10 and 11 receiving the signal of Eq. (8) multiply the received signal by the local carrier $f_0$ to shift the received signal to a baseband. That is, the received signal of:

$$U(t)e^{j(2\pi f_0 t + \Phi_0)}$$

is multiplied by:

$$e^{j(2\pi f_0 t + \Phi_1)}$$

and the transmitted information cos Φ (t) and sin Φ (t) can be obtained by being passed through the low-pass filters 50 and 51. At this time, $\Phi_1$ is an arbitrary instantaneous phase value multiplied by the local carrier at the receiving terminal.

$$U(t)e^{j(2\pi f_0 t + \Phi_0)} \times e^{j(2\pi f_0 t + \Phi_1)}$$
$$= U(t)e^{j(\Phi_0 + \Phi_1)} \cdot e^{j(4\pi f_0 t)} \quad (9)$$

In Eq. (9), since $e^{j(4\pi f_0 t)}$ is a second harmonic of the carrier, it is removed in the low pass filters 50 and 51, so that the value $U(t)e^{j(\Phi_0 + \Phi_1)}$ is obtained. As a result, a signal distorted by $e^{j(\Phi_0 + \Phi_1)}$ with respect to the transmitted information is obtained. The received signal is sampled with $(\frac{1}{4})T$ period according to the sampling theory by the first and second A-D converters 60 and 61 to be digitally processed and is quantized into 8 bits and stored in the dual port memory 110. Thus, the clock pulse train having the frequency four times as large as the bit transfer rate of the transmitting side of the clock generator 80 is generated.

In portable radio communications, in addition to the aforementioned signal distortion, the received signal includes a fading component due to the Doppler effect, the multiple signal paths phenomenon and the Gaussian additional noise component which always exists in the actual component as well. The function of phase delayer 40, which is previously described, is to separate the in-phase component signal and the quadrature phase component signal having a π/2 phase difference.

The mid-amble standard waveform stored in the memory 91 is also made in the same way as the modulator functions, and is stored in advance as are the I and Q component signals. That is, the binary mid-amble data train of a constant length is GMSK-modulated using Eqs. (3) to (7), so that the I and Q components are sampled to a quarter of the data bit period respectively, and are then stored.

The offset error detector 92 repeatedly accesses the dual port memory 110 where the digital data r(t) received is stored and the memory 91 where the standard waveform is stored; thereby, producing information for the slot data interval and the offset error value. The operations will be described in detail as follows. First of all, the offset error detector 92 calculates the linear correlation function value R'rm(τ) with respect to all of the received signal r(t).

$$R'rm(\tau) = \int_{I}^{r(t+\tau)} m^*(\tau)d\tau$$

Here, I is an integration interval and m * (τ) is a conjugate complex number of m(τ). If the correlation function value is calculated with respect to all of r(t), the offset error detector 92 finds out tp when the value P(t) is the largest number among the values of:

$$P(t) = \{R^I rm(t)^2 + R^Q rm(t)^2\}^{\frac{1}{2}}$$

The step for finding the value P(t) can be carried out by comparing each value with the previous value whenever each Rrm(τ) is calculated. Based on the value tp obtained by calculating the linear correlation function, the receiving signal r'(t) of a constant length positioned before and after the value tp is obtained to calculate the quadratic correlation function R"rm(τ). Only the predetermined length of the central part of the standard signal waveform is used in the first calculation and all of the standard signal waveform is used in the second calculation. This is because the standard signal waveform part mixed in r(t) can be changed by the type of the before-and-after data due to the interference phenomenon of the symbols in both boundary parts. As in the calculation of the linear correlation function, the time at the largest quadratic correlation function, i.e., the slot data interval information value tp, is obtained, and at this time, the offset error value of the local carrier, i.e., the offset error value $\Phi_0$ is calculated by the equation of:

$$\Phi_o = \tan^{-1} \frac{R^Q rm(tp)}{R^I rm(tp)}$$

The phase locking portion 93 selects and receives the slot data among the received data stored in the dual port memory 110 by the slot data interval information tp and the offset error value $\Phi_0$ calculated in the offset error detector 92 and locks the phases of I and Q component slot data which are selected and received.

In more detail, the phase locking portion 93 receives a predetermined number of data before and after the slot data interval information tp, and multiplies the received data by the offset error value, thereby generating the locked I and Q component slot data. At this time, the locked slot data W(t) is calculated by the equation:

$$W(t) = rs(t) \cdot e^{-j\Phi_0}.$$

The software determiner 94 integrates the received data bits (i.e., 8 received data) corresponding to the period two times as large as the bit transfer rate among the locked I and Q component slot data W(t) and checks whether the integrated value is larger than the reference value 0 and determines both of two bit data as "1" or "0", and then sequentially generates the bit demodulation data of the determined I and Q components.

And, the GMSK demodulation data detector 95 exclusive-OR gates the I and Q component demodulation data determined in the software determiner to detect the GMSK demodulation data.

The GMSK demodulation data detected in the GMSK demodulation data detector 95 is transmitted through the output terminal 15.

And, in FIG. 2, the part consisting of the memory 91, the offset error detector 92, the phase locking portion 93, the software determiner 94, and the GMSK demodulation data detector 95 can be replaced with the DSP (Digital Signal Processor).

FIGS. 3A-3E is a flowchart of the embodiment of the GMSK signal demodulation method according to the present invention. In FIGS. 3A-3E, step 301 is a frequency converting step, step 302 is an A-D converting step, steps 303 to 324 are offset error detecting steps, steps 325 to 345 are software determining steps, and steps 346 to 356 are GMSK demodulation data detecting steps.

FIG. 4 is a circuit diagram of the GMSK demodulation apparatus for carrying out the flowchart content in FIGS. 3A-3E. In FIG. 4, instead of the part consisting of the memory 91, the offset error detector 92, the phase locking portion 93, the software determiner 94, and the GMSK demodulation data detector 95 in FIG. 2, the DSP 90 is added, and the other parts are the same as those in FIG. 2.

The DSP 90 of FIG. 4 includes therein a processor, a RAM for working, a ROM storing the program for the flowchart of FIGS. 3A-3E and the standard waveform data, and the registers.

Next, the operation of the system shown in FIG. 4 will be described in more detail with reference to the flowchart in FIGS. 3A-3E.

The first mixer 10 mixes the received GMSK signal inputted through the band pass filter 100 with the local carrier $f_0$ which is an output of the local oscillator 30, for shifting into a baseband and separation of the I component signal. Meanwhile, the second mixer 11 mixes the received GMSK signal inputted through the band pass filter 100 with the phase-delayed local carrier $f_0$ inputted through the phase delayer 40, for shifting into a baseband and separation of the Q component signal (in step 301). At this time, the offset errors exist in the I and Q component signals.

The first A-D converter 60 quantizes the I component signal received through the first low-pass filter 50 into a period which is a quarter of the period of the bit transfer rate (i.e., the period is a quarter of the received GMSK signal period T) by the clock pulse train supplied from the clock generator 80 and encodes the quantized I component signal to generate the 8-bit digital I component signal. Meanwhile, the second A-D converter 61 quantizes the Q component signal received through the second low-pass filter 51 into a period which is a quarter of the bit transfer rate by clock pulse train supplied from clock generator 80 and encodes the quantized Q component signal to generate the 8-bit digital Q component signal (in step 302).

The dual port memory 110 stores the digital I component signal and the digital Q component signal generated in the first and second A-D converters 60 and 61 (in step 303). At this time, the capacity of the dual port memory should be capable of storing the digital I and Q component signals corresponding to the one slot data (156 symbol data×4=624 word data).

After carrying out step 304, the DSP 90 down-scales by 3 bits the digital I and Q component signals stored in the working RAM within the DSP in order to prevent the generation of overflow during data operation. (in step 305)

The DSP 90 stores the down-scaled digital I and Q component signals in the working RAM within the DSP. (step 306)

After carrying out step 306, the DSP 90 reads out the standard waveform data m(n)=m(n)+jm(n) which are the reference mid-amble with respect to the I and Q component signals recorded on the ROM within the DSP and then stores the data read on the working RAM of DSP. (in step 307)

After carrying out step 307, the DSP 90 down-scales the standard waveform data by 3 bits to prevent the generation of overflow in the data operating step and stores the data in the working RAM within the DSP again. (in step 308)

After carrying out step 308, the DSP 90 initiates the counter for counting the number of oversamplings within the received GMSK signal period and the received GMSK signal period counter. (in step 309)

After carrying out step 309, the DSP 90 calculates the values $R^I rm[4×j+1]$ and $R^Q rm[4×j+i]$ which are the correlation function values between the first sampled digital I and Q component signals of the first GMSK signal period and the standard waveform data m(n)=m(n)+jm(n). (in step 310)

After carrying out step 310, the DSP 90 stores the correlation function values $R^I rm[4×j+1]$ and $R^Q rm[4×j+i]$ with respect to the first sampled digital I and Q component signals of the first GMSK signal period on the working RAM therein. (in step 311)

After carrying out step 311, the DSP 90 checks whether the value j of the GMSK signal period counter within the DSP is greater than or equal to 102. (in step 312)

When the value j of the GMSK period counter is smaller than 102 in step 312, the DSP 90 adds 1 to the value j of the GMSK period counter and then goes back to step 310. (in step 313) Here, 102 is determined by subtracting mid-amble data from the bit number of one slot data and then adding 1 to the subtracted result.

When the value j of the GMSK period counter is equal to or greater than 102 in step 312, the DSP 90 checks whether the value of the oversampling number counter within DSP is greater than or equal to 4. (in step 314)

When the value i of the oversampling number counter is smaller than 4 in step 314, the DSP 90 adds 1 to the value i of the oversampling number counter and then goes back to step 310. (in step 315)

When the value i of the oversampling counter is greater than or equal to 4 in step 314, the DSP 90 initiates the value k of the correlation coefficient calculation number counter within the DSP. (in step 316)

After carrying out step 316, the DSP 90 sums the first correlation function values $R^I rm[4×1+1]$ and $R^Q rm[4×1+1]$ with respect to the digital I and Q component signals stored in the working RAM within DSP to calculate the first correlation coefficient corr(k)-=$R^I rm[4×1+1]+R^Q rm[4×1+1]$. (in step 317)

After carrying out step 317, the DSP 90 checks whether the value of the correlation coefficient calculation number counter is greater than 412. (in step 318)

When the value k of the correlation coefficient calculation number counter is smaller than 412 in step 318, the DSP 90 adds 1 to the value k of the correlation coefficient calculation number counter and then goes back to step 317. (in step 319)

When the value k of the correlation coefficient calculation number counter is greater than 412 in step 318, the DSP 90 searches the maximum correlation coefficient among the 412 calculated correlation coefficients corr[k]. (in step 320)

After carrying out step 320, the DSP 90 searches the number tp of the digital I and Q component signals corresponding to the maximum correlation coefficient (i.e., the slot data interval information). (in step 321)

After carrying out step 321, the DSP 90 selects the predetermined number of the digital I and Q component signals which are positioned before and after the slot data interval information tp and determines four groups of 156 digital I and Q component signals. (in step 322)

After carrying out step 322, the DSP 90 divides the correlation function $R^Q rm(tp)$ with respect to the digital I component signal in the slot data interval information tp by the correlation function $R^I rm(tp)$ with respect to the digital Q component signal in the slot data interval information tp. (in step 323)

After carrying out step 323, the DSP 90 calculates the arc tangent ($\tan^{-1}$) of the $R^Q rm(tp)/R^I rm(tp)$ calculated in step 323 to produce the offset error value $\Phi$.

After carrying out step 324, the DSP 90 calculates the approximate value $\sin \Phi$ of the sine function with respect to the offset error value $\Phi$. (in step 325)

After carrying out step 325, the DSP 90 calculates the approximate value $\cos \Phi$ of the cosine function with respect to the offset error value $\Phi$. (in step 326)

After carrying out step 325, the DSP 90 calculates the exponent function value $e^{-j\Phi}=\cos \Phi - j \sin \Phi$ by the approximate value of the sine and cosine functions and then multiplies the calculated exponent function value $e^{-j\Phi}$ by the 624 digital I and Q component signals to compensate the phases of the digital I and Q component signals. (in step 327)

After carrying out step 327, the DSP 90 initiates the value Ii of the I component integration counter within DSP into "0". (in step 328)

After carrying out step 328, the DSP 90 integrates the first 8 digital I component signals corresponding to the two periods of the GMSK signal. (in step 329)

After carrying out step 329, the DSP 90 checks whether the integrated value $$SIi = \int_{2IiT}^{(2Ii+2)T} RIs(t)dt$$

is greater than or equal to "0". (in step 330)

When the integrated value SIi is greater than "0" in step 330, the DSP 90 determines the logic value of the (2Ii)th GMSK signal period to be "1". (in step 331)

After carrying out step 331, the DSP 90 sets the logic value of the (2Ii+1)th GMSK signal period to "1". (in step 332)

When the integrated value SIi is smaller than "0" in step 330, the DSP 90 sets the logic value of the (2Ii)th GMSK signal period to be "0". (in step 333)

After carrying out step 333, the DSP 90 sets the logic value of the (2Ii+1)th GMSK signal period to "0". (in step 334)

After carrying out step 332 or 334, the DSP 90 checks whether the value Ii of the I component integration counter is greater than 78. (in step 335)

When the value Ii of the I component integration counter is smaller than 78 in step 335, the DSP 90 adds 1 to the value Ii of the I component integration counter and then goes back to step 329. (in step 336)

When the value Ii of the I component integration counter is greater than 78 in step 335, the DSP 90 initiates the value Qi of the Q component integration counter to be "0". (in step 337)

After carrying out step 337, the DSP 90 integrates the first 8 digital Q component signals corresponding to the two periods of the GMSK signal. (in step 338)

After carrying out step 338, the DSP 90 checks whether the integration value $$SQi = \int_{(2Qi + 1)T}^{(2Qi + 3)T} RQs(t)dt$$

is greater than or equal to "0". (in step 339)

When the integration value SQi is greater than "0" in step 339, the DSP 90 determines the logic value of the (2Qi)th GMSK signal period to be "1". (in step 340)

After carrying out step 340, the DSP 90 sets the logic value of the (2Qi+1)th GMSK signal period "1". (in step 341)

When the integrated value SQi is smaller than "0" in step 339, the DSP 90 sets the logic value of th (2Qi)th GMSK signal period to "0". (in step 342)

After carrying out step 342, the DSP 90 sets the logic value of the (2Qi+1)th GMSK signal period to "0". (in step 343)

After carrying out step 341, or 343, the DSP 90 checks whether the value Qi of the Q component integration counter is greater than 78. (in step 344)

When the value Qi of the Q component integration counter is smaller than 78 in step 344, the DSP 90 adds 1 to the value Qi of the Q component integration counter, and then goes back to step 338. (in step 345)

When the value Qi of the Q component integration counter is greater than 78 in step 344, the DSP 90 initiates the value bj of the bit data calculation counter within DSP to be "0". (in step 346)

After carrying out step 346, the DSP 90 exclusive-OR gates teh I component bit data and the Q component bit data corresponding to the value bj of the bit data calculation counter. (in step 347)

After carrying out step 347, the DSP 90 checks whether the value bj of the bit data calculation counter is greater than or equal to 156 which is the bit number of the slot data. (in step 348)

When the value bj of the bit data calculation counter is smaller than 156 in step 348, the DSP 90 adds 1 to the value bj of the bit data calculation counter and then goes back to step 347. (in step 349)

When the value bj of the bit data calculation counter is greater than 156 in step 348, the DSP 90 initiates the value CK of the I component clock counter to be "0". (in step 350)

After carrying out step 350, the DSP 90 inverts the logic value of the bit data corresponding to the value 2CK which is two times as large as the I component clock counter among the 156 bit data which are exclusive-OR gated. (in step 351)

After carrying out step 351, the DSP 90 checks whether the value CK of the I component clock counter is greater than or equal to 78. (in step 352)

When the value CK of the I component clock counter is smaller than 78 in step 352, the DSP 90 adds "1" to the value CK of the I component clock counter, and then goes back to step 350. (in step 353)

As described above, according to the present invention, even if an analog type feedback loop circuit is not used and the clock pulse on the transmitted GMSK signal is not restored by compensating the offset error by digital processing, there are advantages in that the GMSK signal can be exactly restored, the constitution of the circuit is easy, there is reduction of power consumption and the miniaturization of the set can be achieved.

What is claimed is:

1. A method for demodulating a GMSK signal comprising:
   a frequency converting step of shifting a received GMSK signal into a baseband and separating the shifted signal into I and Q component signals;
   an A-D converting step of quantizing the I and Q component signals of the baseband separated in the frequency converting step and encoding the quantized I and Q component signals received to generate I and Q component data;
   an offset error detecting step of checking the correlation between the I and Q component data generated in said A-D converting step and the standard waveform data to detect a slot interval and an offset error;
   a phase locking step of selecting the I and Q component slot data by the slot interval information and the offset error amount detected in said offset error detecting step and compensating the offset error of the selected I and Q component slot data; and
   software decision step of integrating a predetermined number of data among the I and Q component slot data compensated in the phase locking step and determining the I and Q component demodulation data according to the result of the integration.

2. A method for demodulating a GMSK signal as claimed in claim 1, wherein said offset error detecting step calculates the correlative function values of data in the interval where the mid-amble among the I and Q component data is excluded, calculates the correlation coefficients by the calculated correlative function value, and checks said calculated correlation coefficients to detect the slot data and the phase error of the slot data.

3. A method for demodulating a GMSK signal as claimed in claim 1, wherein said quantization period is a quarter of the data bit period.

4. An apparatus for demodulating a GMSK signal comprising:
   frequency converting means for shifting a received GMSK signal into a baseband and separating the shifted signal into I and Q component signals;
   A-D converting means for quantizing the I and Q component signals of the baseband separated in the frequency converting means into a predetermined period and encoding the quantized I and Q component signals to generate I and Q component data;

a memory where the standard waveform data with respect to the standard waveform is stored;

offset error detecting means for checking the correlation between the I and Q component data generated in said A-D converting means and the standard waveform data stored in the memory;

phase locking means for selecting I and Q component slot data by the slot interval information and the offset error detected in said offset error detecting means and compensating the offset error of the selected I and Q component slot data; and a software decision means for integrating the predetermined number of data among the I and Q component slot data compensated in the phase locking means and determining the I and Q component demodulation data according to the integrated result.

5. An apparatus for demodulating a GMSK signal as claimed in claim 4, wherein the quantization period of said A-D converter is a quarter of the data bit period.

* * * * *

UNITED STATES PATENT AND TRADEMARK OFFICE
CERTIFICATE OF CORRECTION

PATENT NO. : 5,144,256
DATED : September 1, 1992
INVENTOR(S) : Mu-gil Lim It is certified that error appears in the above-identified patent and that said Letters Patent is hereby corrected as shown below:

Drawings:
Figure 3A, step 308 "REFERANCE" should be --REFERENCE--.
Col. 3, line 24 delete "are".
Col. 4, line 26 "h(t)*rect" should be --h(t)*rect--.
Col. 4, line 28 "Here, *" should be --Here, *--.
Col. 5, line 3 "1 T" should be --1T--.
Col. 5, line 59 "70" should be --110--.
Col. 6, line 14 after "receiving" insert --bandpass--.
Col. 8, line 4 "data)" should be --data bits)--.
Col. 8, line 21 "the" should be --a--.
Col. 8, line 23 "is" should be --are--.
Col. 11, line 35 "th" should be --the--.
Col. 11, line 52 "teh" should be --the--.

Signed and Sealed this

Nineteenth Day of October, 1993

Attest:

BRUCE LEHMAN

*Attesting Officer*     Commissioner of Patents and Trademarks